(12) United States Patent
Chuo et al.

(10) Patent No.: US 7,988,465 B2
(45) Date of Patent: *Aug. 2, 2011

(54) CIRCUIT BOARD BASED CONNECTOR WITH RAISED PROJECTION SECTION

(75) Inventors: Chih-Heng Chuo, Zhongli (TW); Gwun-Jin Lin, Taoyuan (TW); Kuo-Fu Su, Zhongli (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 118 days.

This patent is subject to a terminal disclaimer.

(21) Appl. No.: 12/588,278

(22) Filed: Oct. 9, 2009

(65) Prior Publication Data

US 2011/0028017 A1 Feb. 3, 2011

(30) Foreign Application Priority Data

Jul. 29, 2009 (TW) .................. 98125579 A

(51) Int. Cl.
*H01R 13/648* (2006.01)
(52) U.S. Cl. ........................................... 439/98
(58) Field of Classification Search ............ 439/98, 439/67, 77, 492, 495, 497
See application file for complete search history.

(56) References Cited

U.S. PATENT DOCUMENTS

| 7,189,105 | B2* | 3/2007 | Takaku et al. ............... 439/497 |
| 7,322,852 | B2* | 1/2008 | Nagata et al. ............... 439/579 |
| 7,789,678 | B2* | 9/2010 | Nagata et al. ............... 439/108 |
| 2009/0221165 | A1* | 9/2009 | Buck et al. ............... 439/108 |
| 2010/0081334 | A1* | 4/2010 | Kagotani ............... 439/639 |

\* cited by examiner

*Primary Examiner* — T C Patel
*Assistant Examiner* — Phuongchi T Nguyen
(74) *Attorney, Agent, or Firm* — Rosenberg, Klein & Lee

(57) ABSTRACT

Provided is a circuit board based connector with raised projection section, which is formed by applying substrate bonding and formation techniques to make a connector that features a raised projection section. The circuit substrate has an end that is provided with conductive terminals and an opposite end that is provided with flat cable connection terminals for connection with a flat cable. The circuit substrate has a first surface on which the projection section is formed. A shielding layer covers the projection section and a portion of the first surface. The circuit substrate has a second surface on which a second shielding layer is selectively formed. When the circuit substrate is inserted into an insertion space defined in a connection socket with the conductive terminals thereof, the shielding layer and the projection section of the circuit substrate are put into engagement with and thus retained by the insertion space of the connection socket to thereby fix within the connection socket.

12 Claims, 8 Drawing Sheets

CIRCUIT BOARD BASED CONNECTOR WITH RAISED PROJECTION SECTION

FIELD OF THE INVENTION

The present invention relates to an electrical connector, and in particular to a circuit board based connector with raised projection section, which is formed by applying substrate bonding and formation techniques.

BACKGROUND OF THE INVENTION

Connectors are commonly incorporated in the layout of circuit for various electrical equipments, such as computers, mobile phones, digital cameras, global positioning systems (GPSs), liquid crystal display (LCD) panel, and measuring instruments and controlling devices, for connecting a signal cable, a coaxial cable, or a flat cable to a circuit board, a circuit module, or an electrical device to realize transmission of electrical signals. A regular connector comprises conductive terminals that form electrical engagement with contacts included in a circuit layout on a circuit board to form electrical connection.

A conventional connector comprises conductive terminals and flat cable connection terminals. The conductive terminals are used to mate and engage counterpart conductive terminals set inside a connection socket. The flat cable connection terminals are connected to a flat cable.

SUMMARY OF THE INVENTION

However, in mating with a connection socket, since the contact surface of an insertion end of a conventional connector and the contact surface of the connection socket are both flat surfaces, the resulting mating force therebetween is generally insufficient, whereby the conductive terminals of the connector and the connection socket are susceptible to disengagement from each other, leading to instability of the electrical connection.

The conventional connector, when mating with a conventional connection socket, requires an additional retention structure to provide secured coupling with the connection socket. This makes the conventional connector that is equipped with an additional retention structure suffering the disadvantages of complicated structure, high cost of molds, and tedious assembling process.

Further, the conventional connector is not capable of effectively eliminating external electromagnetic interference due to incomplete shielding and poor grounding. Consequently, the conventional connector often suffers noise induced in the transmission of signal between circuit systems, which adversely affects the quality of signal.

Thus, an objective of the present invention is to provide a circuit board based connector, which effectively improves the drawbacks of the conventional connectors in respect of complicated manufacturing process, high cost molds, and being unable to eliminate external electromagnetic interference.

Another objective of the present invention is to provide a circuit board based connector that features a raised projection section, which is formed by means of substrate bonding and formation techniques, whereby signal transmission between male and female portions of a connector assembly is made precise and undesired detachment between the portions is prevented.

The technical solution that the present invention adopts to overcome the above discussed problems is a circuit board based connector, which is formed by applying substrate etching and bonding and formation techniques to make a connector that features a raised projection section. The circuit substrate has an end that is provided with conductive terminals and an opposite end that is opposite to the conductive terminals and provided with flat cable connection terminals for connection with a flat cable. The circuit substrate has a first surface on which the projection section is formed. A first shielding layer covers the projection section and a portion of the first surface. The circuit substrate has a second surface on which a second shielding layer is selectively formed. When the circuit substrate is inserted into an insertion space defined in a connection socket with the conductive terminals thereof, the shielding layer and the projection section of the circuit substrate are put into engagement with and thus retained by the insertion space of the connection socket to thereby fix within the connection socket.

In a preferred embodiment of the present invention, the shielding layers on the first and second surfaces of the circuit substrate are set in electrical connection with a preset grounding terminal of a connection socket, or are connected to a preset grounding pattern formed in the circuit substrate through via connection.

With the technical solution adopted in the present invention, a connector is provided with a projection section of a predetermined height, so as to allows a shielding layer and the projection section that are provided on a circuit substrate of the connector to matingly engage and thus fix in a connection socket. Further, the connector in accordance with the present invention is simpler than a conventional connector in respect of structure and manufacturing process and is also cheaper than the conventional connector.

Further, the connector of the present invention comprises shielding layers that drain signals associated with external electromagnetic interference to a circuit board connected thereto to provide excellent shielding effect.

Further, the circuit board based connector of the present invention can be formed by applying the generally known techniques of circuit etching, bonding, and formation and is applicable to either, a single-sided substrate, a double-sided substrate, or a multiple-layer substrate to suit the needs of various applications.

In the applications of the present invention to the double-sided substrates, circuit layout of variable alignment jumper can be used, whereby a specific signal terminal on a first surface of a circuit substrate can be set in connection with a specific signal terminal of another conductive layer of the circuit substrate through a conductive substance provided inside a via.

In respect of being compact, the connector of the present invention is particularly suitable for a device that requires fine pitch of terminals and small size. For a regular small-sized electronic product, signal transmission is often realized through connection between a connector of the type discussed herein and a counterpart connection socket. The present invention provides a structure of plug type connector by means of substrate bonding and stacking techniques, which forms a connector comprises a circuit board jumper structure. The present invention reduces the manufacturing costs of a plug type connector and allows for mass production through the conventional circuit substrate manufacturing process.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1:
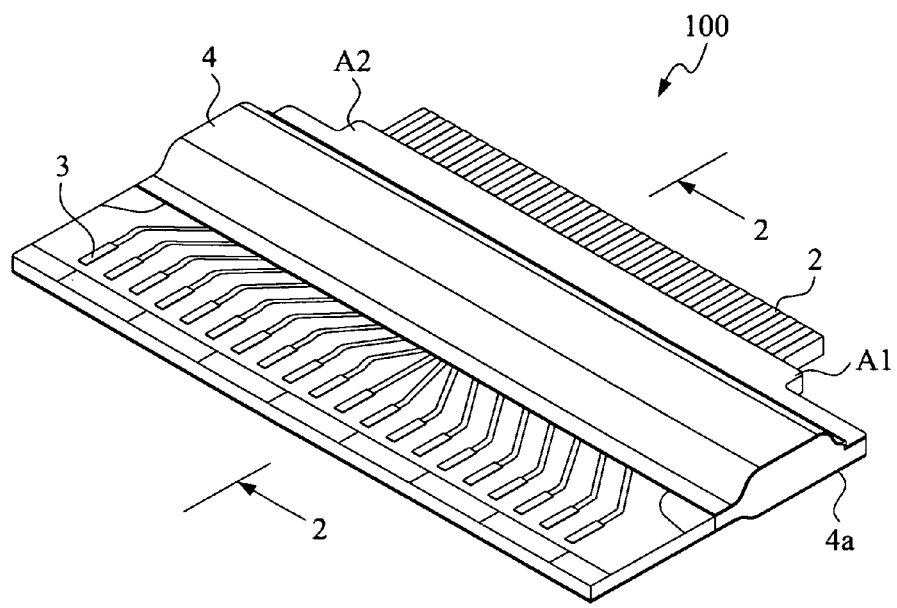
FIG. 1 is a perspective view of a first embodiment in accordance with the present invention.
Figure 2:
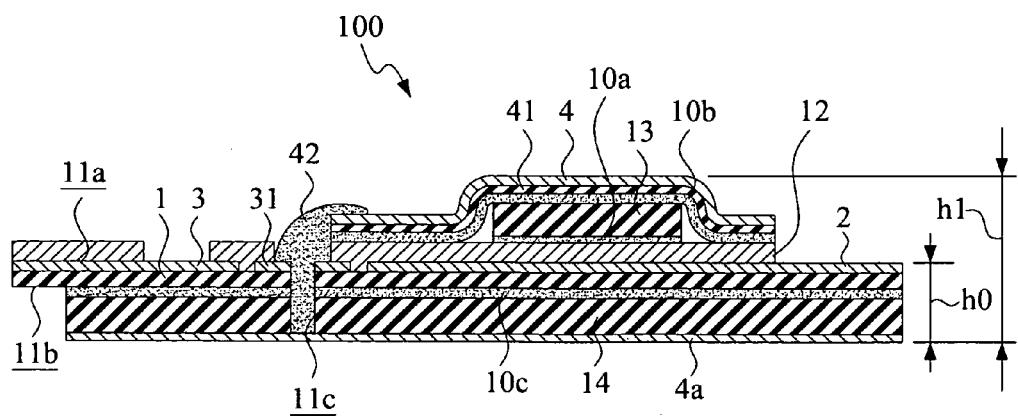
FIG. 2 is a cross-sectional view taken along line 2-2 of FIG. 1.

With reference to the drawings and in particular to FIGS. 1 and 2, of which FIG. 1 shows a perspective view of a first embodiment in accordance with the present invention and FIG. 2 shows a cross-sectional view taken along line 2-2 of FIG. 1, the present invention provides an circuit board based connector with raised projection section, generally designated at 100. The circuit board based connector 100 comprises a circuit substrate 1. The circuit substrate 1 has a first surface 11a and a second surface 11b. An end of the circuit substrate 1 is provided with a plurality of spaced conductive terminals 2. The circuit substrate 1 also has an end opposite to the conductive terminals 2 and provided with a plurality of spaced flat cable connection terminals 3.

The circuit substrate 1 is covered with an insulation layer 12. Bonded atop the insulation layer 12 with an adhesive layer 10a is at least one projection section 13, which is raised above a reference datum plane defined by the first surface 11a of the circuit substrate 1 by a predetermined height and extends on the reference datum plane in a direction toward a location adjacent to the conductive terminals 2 of the circuit substrate 1.

A first shielding layer 4 overlaps the projection section 13 and a portion of the first surface 11a of the circuit substrate 1. In the instant embodiment, the first shielding layer 4 is made of metal to provide electromagnetic shielding. The first shielding layer 4 has an undersurface forming a substrate 41 that is bonded to a surface of the projection section 13 by an adhesive layer 10b. The second surface 11b of the circuit substrate 1 is bonded to a substrate 14 with an adhesive layer 10c, and the substrate 14 has an undersurface to which a second shielding layer 4a is attached.

Figure 3:
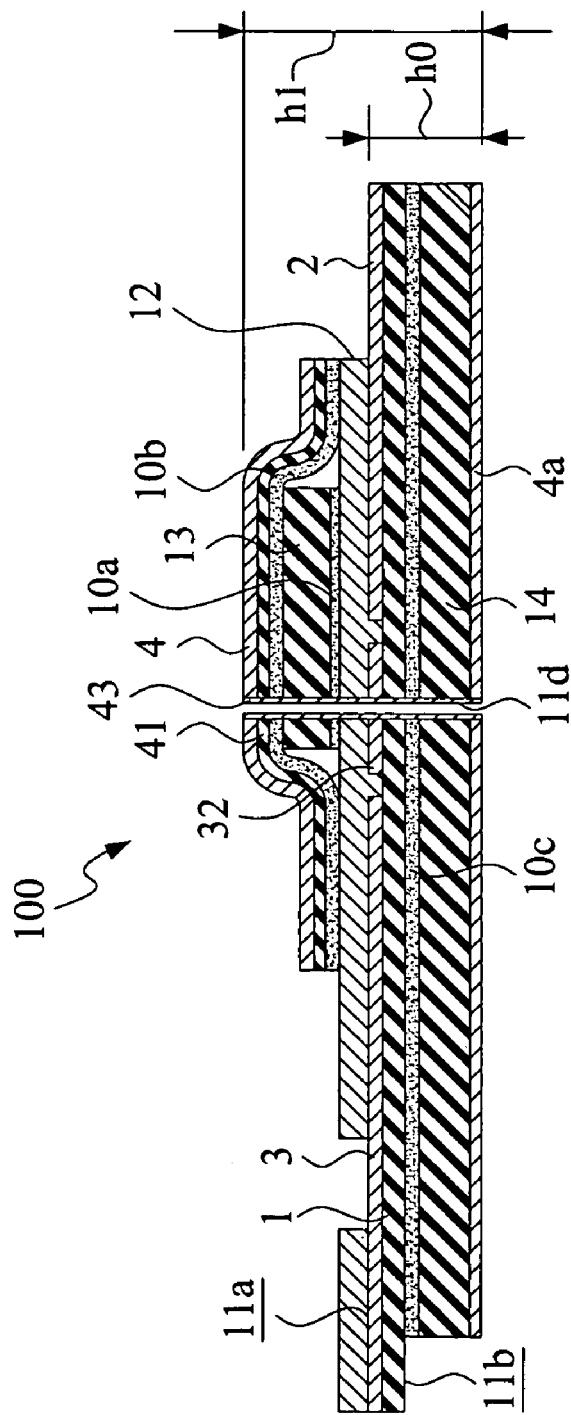
FIG. 3 is a cross-sectional view similar to FIG. 2 but showing a different embodiment of a via.

The first shielding layer 4 and the second shielding layer 4a are engageable with grounding terminals preset in a connection socket, or are connectable with solder 42 filled in a via 11c defined through the circuit substrate 1 (as shown in FIG. 2) or connectable with each other through a conductive substance 43 formed on an inside surface of the via 11c (see FIG. 3) and further connectable with a grounding pattern 31 formed in the circuit substrate 1.

Figure 4:
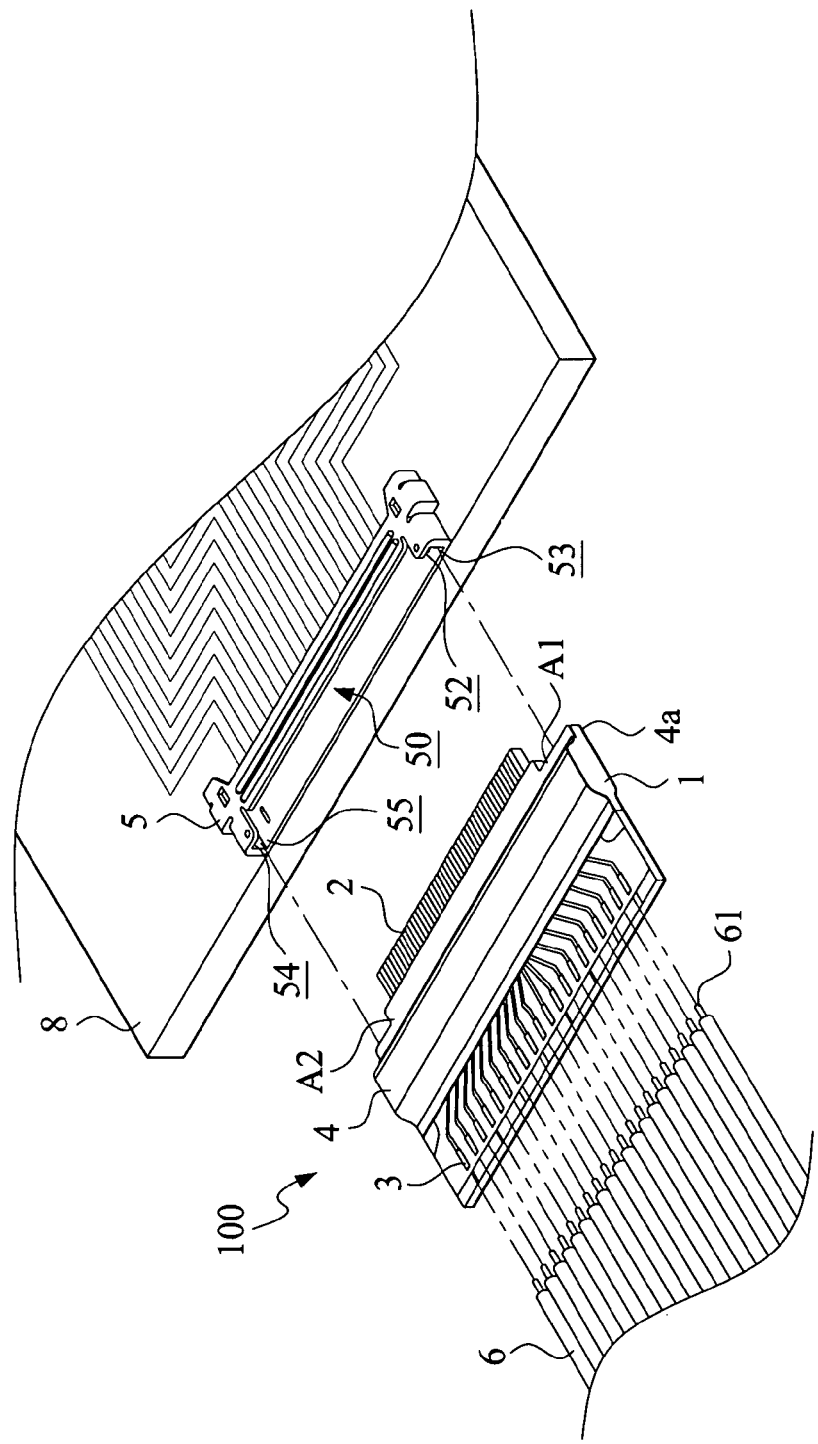
FIG. 4 is a perspective view showing a connector of the first embodiment of the present invention, a flat cable, and a connection socket in a separated form.
Figure 5:
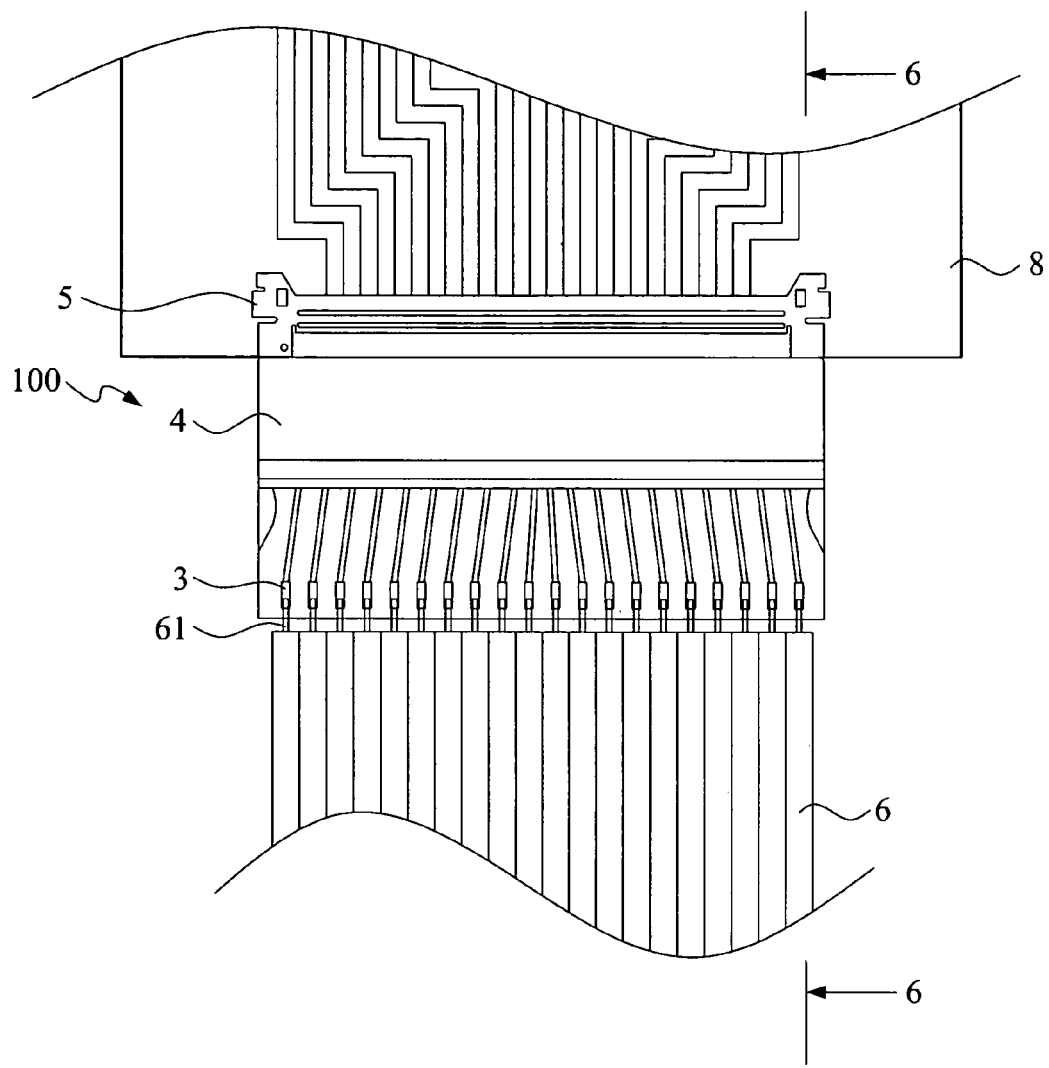
FIG. 5 is a plan view showing the connector of the first embodiment of the present invention, the flat cable, and the connection socket in an assembled form.
Figure 6:
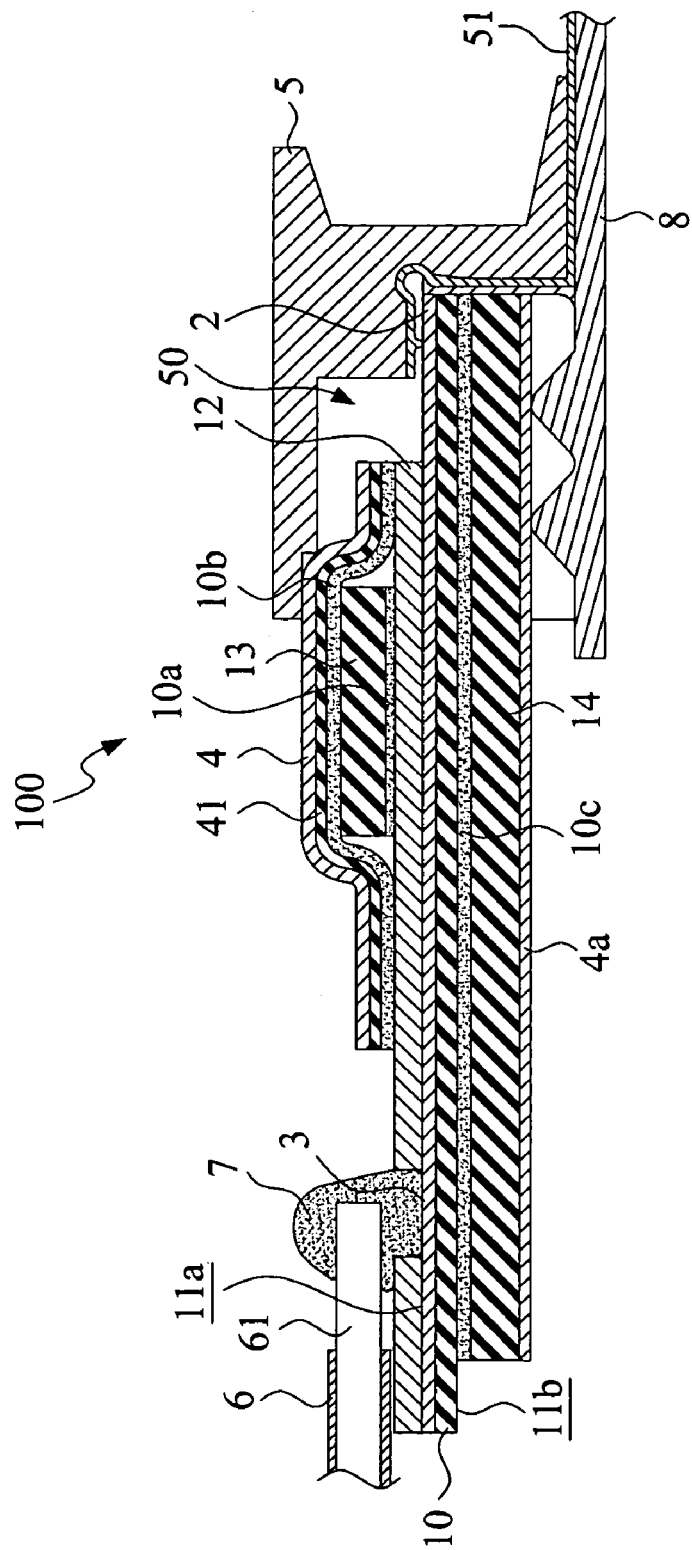
FIG. 6 is a cross-sectional view taken along line 6-6 of FIG. 5.

Referring to FIGS. 4-6, the circuit substrate 1 is insertable into a connection socket or a female connector 5 with the conductive terminals 2 thereof and provides a desired height h0 that allows for engagement of the conductive terminals 2 with corresponding conductive contacts 51 set in the connection socket 5 and a height h1 that allows for retained engagement of the circuit board based connector 100 within the connection socket 5.

In the instant embodiment, the flat cable connection terminals 3 of the circuit substrate 1 are provided for connection with a flat cable 6. The flat cable 6 has conductive terminals 61 that are respectively bonded to the flat cable connection terminals 3 by means of solders 7 or other measures (such as clamping).

The flat cable 6 that mentioned above in the disclosure of the present invention provides only an illustrative one of various examples and the flat cable 6 can be for example a regular signal cable, a coaxial cable, or a flexible printed circuit.

The connection socket 5 is mounted to a circuit board 8. When the connector 100 that carries a flat cable 6 is inserted into an insertion space 50 defined in the connection socket 5, the plurality of conductive terminals 2 of the connector 100 is precisely located to respectively engage the conductive contacts set inside the connection socket 5 to establish electrical connection therebetween for transmission of electrical signals. The first shielding layer 4, the second shielding layer 4a, and the projection section 13 of the circuit substrate 1 together define a first local zone A1 and a second local zone A2, which are put into contact with and thus retained in position by opposite walls 52, 53, 54, 55 on opposite sides of the insertion space 50 of the connection socket 5 so as to position and fix the connector 100 within the connection socket 5. The first shielding layer 4 and the second shielding layer 4a of the circuit substrate 1 effectively shield external electromagnetic interference.

The description provided above is made with respect to an example of a single-sided board, and the technical of the present invention is equally applicable to a double-sided board or a multiple-layered board to provide the desired connection. Of course, based on the wire layout of a double-sided board or a multiple-layered board, the flat cable connection terminals of the connector in accordance with the present invention can be selectively set on the first surface, or the second surface, or both of the circuit substrate to suit the needs of various applications. It is noted that what is illustrated here is just a preferred embodiment of the present invention.

Figure 7:
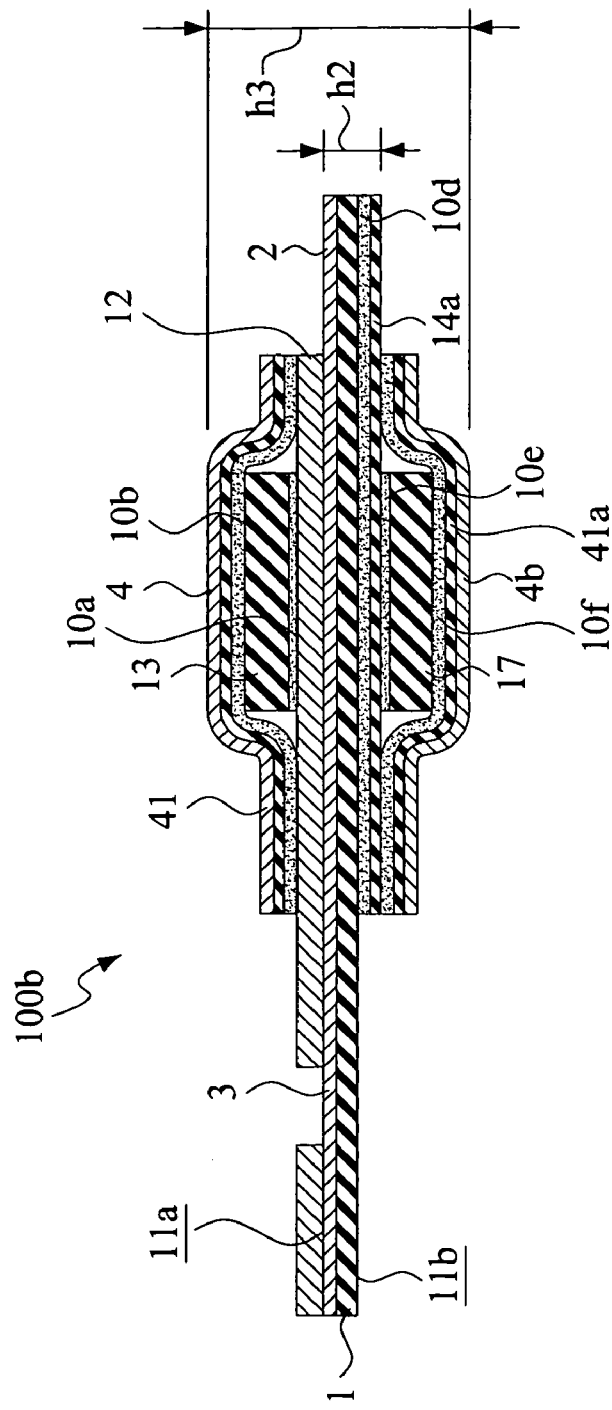
FIG. 7 is a cross-sectional view of a second embodiment in accordance with the present invention.

FIG. 7 is a cross-sectional view of a second embodiment in accordance with the present invention. In the embodiment, the circuit board based connector of the present invention, which is designated at 100b for distinction, is composed of the same or similar constituent components as those of the first embodiment and a difference between the two embodiments resides in that, in the instant embodiment, the second surface 11b of the circuit substrate 1 is bonded to a substrate 14a with an adhesive layer 10d. Bonded to an undersurface of the substrate 14a with an adhesive layer 10e is a projection section 17, which projects beyond a reference datum plane defined by the second surface 11b of the circuit substrate 1 by a predetermined height and is bonded to a substrate 41a and a third shielding layer 4b with an adhesive layer 10f. The third shielding layer 4b overlaps the projection section 17 and a portion of the second surface 11b of the circuit substrate 1 to show the configuration illustrated in the drawing, wherein the conductive terminals 2 of the connector 100b of the present invention provide a desired height h2 that allows for engagement with conductive contacts of the connection socket and a height h3 that allows for retained engagement of the connector within the connection socket is also provided.

Figure 8:
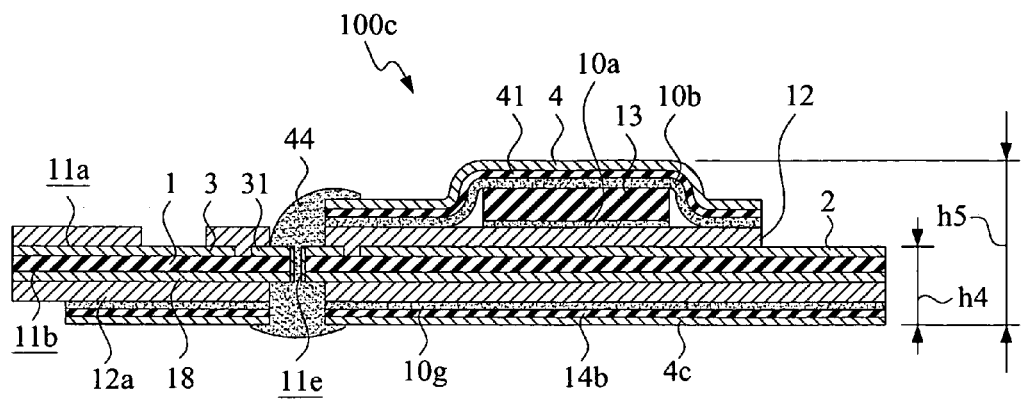
FIG. 8 is a cross-sectional view of a third embodiment in accordance with the present invention.

FIG. 8 is a cross-sectional view of a third embodiment in accordance with the present invention. In the embodiment, the circuit board based connector of the present invention, which is designated at 100c for distinction, is composed of the same or similar constituent components as those of the first embodiment shown in FIG. 2 and a difference between the two embodiments is that the first embodiment is applied to a single-sided circuit substrate, while the instant embodiment is applied to a double-sided circuit substrate. Namely, the second surface 11b of the circuit substrate 1 has an undersurface forming a conductive layer 18 and an insulation layer 12a. The insulation layer 12a has an undersurface bonded to a substrate 14b with an adhesive layer 10g. A fourth shielding layer 4c is formed on an undersurface of the substrate 14b, whereby the conductive terminals 2 of the connector 100c of the present invention provide a desired height h4 that allows for engagement with conductive contacts of the connection socket and a height h5 that allows for retained engagement of the connector within the connection socket is also provided.

Figure 9:
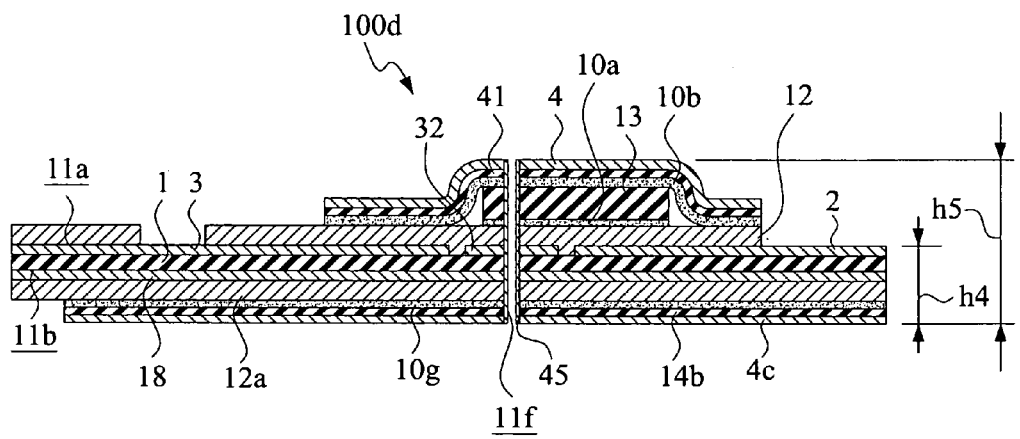
FIG. 9 is a cross-sectional view of a fourth embodiment in accordance with the present invention.

The first shielding layer 4 and the fourth shielding layer 4c are connected to each other through a via 11e and solder 44 and are also in electrical connection with a grounding pattern 31 preset in the circuit substrate 1, or are connected through a via 11f that carries a conductive substance 45 (see FIG. 9 that shows a cross-sectional view of a circuit board based connector 100d in accordance with a fourth embodiment of the present invention) and also in electrical connection with a grounding pattern 32 preset in the circuit substrate 1.

Figure 10:
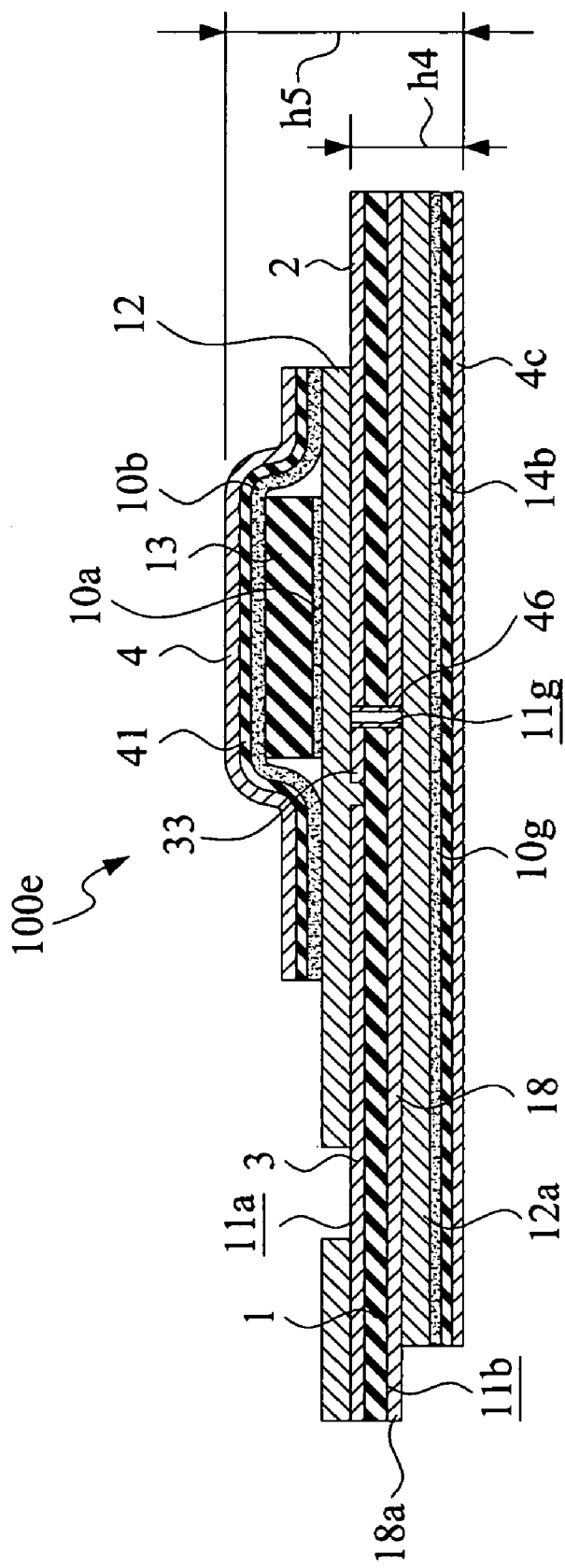
FIG. 10 is a cross-sectional view of a fifth embodiment in accordance with the present invention.

FIG. 10 is a cross-sectional view of a fifth embodiment in accordance with the present invention. The embodiment provides a circuit board based connector 100e that is applicable to a double-sided circuit substrate. Namely, the second surface 11b of the circuit substrate 1 has an undersurface that forms a conductive layer 18 and an insulation layer 12a. The insulation layer 12a has an undersurface that is bonded to a substrate 14b with an adhesive layer 10g and a fourth shielding layer 4c is formed on an undersurface of the substrate 14b. In this embodiment, the insulation layer 12a does not completely covers or overlaps the whole conductive layer 18 and at least one flat cable connection terminal 18a is formed on the undersurface of the conductive layer 18 at a selected location.

To connect flat cables to the connector 100e, the conductive terminals of a flat cable can be bonded to the flat cable connection terminals 3 with solders, or the conductive terminals of another flat cable can be bonded to the flat cable connection terminals 18a with solders, or the conductive terminals of a first upper-side flat cable can be bonded to the flat cable connection terminals 3 with solders and the conductive terminals of a second lower-side flat cable can also be bonded to the flat cable connection terminals 18a with solders.

In the applications of the present invention to the double-sided substrates, circuit layout of variable alignment jumper can be used. In other words, the circuit substrate 1 forms a via 11g and the via 11g has an inside surface to which a conductive substance 46 (see FIG. 10) is applied, whereby a specific signal terminal 33 on the first surface 11a of the circuit substrate 1 can be set in connection with another conductive layer 18 of the circuit substrate 1 through the conductive substance 46 of the via 11g so as to realize signal jumper.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A circuit board based connector, comprising:
   a circuit substrate having an end that is provided with a plurality of conductive terminals, a plurality of flat cable connection terminals being formed on an end of the circuit substrate that is opposite to the conductive terminals for connection with a flat cable, the circuit substrate having a first surface and a second surface, an insulation layer being formed on the first surface of the circuit substrate, at least one projection section being formed on the insulation layer of the first surface of the circuit substrate and the projection section being raised above a reference datum plane defined by the first surface of the circuit substrate by a predetermined height and extends on the reference datum plane in a direction toward a location adjacent to the conductive terminals of the circuit substrate, whereby when the circuit substrate is inserted into an insertion space defined in a connection socket with the conductive terminals thereof, at least a local zone defined by the projection section is put into engagement with and thus retained by opposite walls of the insertion space of the connection socket;
   a first shielding layer that overlaps the projection section; and
   a second shielding layer that is formed on the second surface of the circuit substrate, the first shielding layer and the second shielding layer being connected to a preset grounding pattern through a via defined through the circuit substrate and a conductive substance being formed on an inside surface of the via.

2. The circuit board based connector as claimed in claim 1, wherein the projection section is bonded to the insulation layer by an adhesive layer.

3. The circuit board based connector as claimed in claim 1, wherein the second surface of the circuit substrate is bonded to a substrate and the substrate has an undersurface to which a second shielding layer is attached.

4. The circuit board based connector as claimed in claim 1, wherein the second shielding layer has a top surface that forms a substrate and the substrate has a top surface that is bonded under the second surface of the circuit substrate by an adhesive layer.

5. The circuit board based connector as claimed in claim 1 further comprising a first shielding layer that overlaps the projection section.

6. The circuit board based connector as claimed in claim 5, wherein the first shielding layer has an undersurface forming a substrate that is bonded to a top surface of the projection section by an adhesive layer.

7. The circuit board based connector as claimed in claim 1, wherein the second surface of the circuit substrate is bonded to a substrate, a projection section being formed on an undersurface of the substrate, the projection section projecting beyond a reference datum plane defined by the second surface of the circuit substrate by a predetermined height.

8. The circuit board based connector as claimed in claim 7 further comprising a third shielding layer that overlaps the projection section.

9. The circuit board based connector as claimed in claim 8, wherein the third shielding layer has a top surface forming a substrate, which is bonded to an undersurface of the projection section by an adhesive layer.

10. The circuit board based connector as claimed in claim 1, wherein the second surface of the circuit substrate has an undersurface forming a conductive layer, the conductive layer having an undersurface forming an insulation layer.

11. The circuit board based connector as claimed in claim 10, wherein the insulation layer has an undersurface bonded to a fourth shielding layer with an adhesive layer.

12. The circuit board based connector as claimed in claim 10, wherein the insulation layer partly covers an undersurface of the conductive layer whereby at least one flat cable connection terminal is formed on the undersurface of the conductive layer at a selected location.

* * * * *